United States Patent
Thalhammer et al.

(10) Patent No.: US 10,128,813 B2
(45) Date of Patent: Nov. 13, 2018

(54) BULK ACOUSTIC WAVE (BAW) RESONATOR STRUCTURE

(71) Applicant: Avago Technologies General IP (Singapore) Pte. Ltd., Singapore (SG)

(72) Inventors: Robert Thalhammer, Munich (DE); Alexandre Shirakawa, San Jose, CA (US); Thomas Faust, Munich (DE); Phil Nikkel, Loveland, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 205 days.

(21) Appl. No.: 15/135,254

(22) Filed: Apr. 21, 2016

(65) Prior Publication Data

US 2017/0310303 A1    Oct. 26, 2017

(51) Int. Cl.
*H03H 9/02*        (2006.01)
*H03H 9/58*        (2006.01)
*H03H 9/17*        (2006.01)

(52) U.S. Cl.
CPC .... *H03H 9/02118* (2013.01); *H03H 9/02102* (2013.01); *H03H 9/02125* (2013.01); *H03H 9/173* (2013.01); *H03H 9/58* (2013.01); *H03H 9/582* (2013.01)

(58) Field of Classification Search
CPC ........... H03H 9/02118; H03H 9/02102; H03H 9/132; H03H 9/173; H03H 9/58; H03H 9/582; H03H 9/02125
USPC .................................. 333/187, 188; 310/312
See application file for complete search history.

(56) References Cited

U.S. PATENT DOCUMENTS

| | | |
|---|---|---|
| 5,587,620 A | 12/1996 | Ruby et al. |
| 5,872,493 A | 2/1999 | Ella |
| 5,873,153 A | 2/1999 | Ruby et al. |
| 5,910,756 A | 6/1999 | Ella |
| 6,107,721 A | 8/2000 | Lakin |
| 6,262,637 B1 | 7/2001 | Bradley et al. |
| 6,507,983 B1 | 1/2003 | Ruby et al. |
| 6,828,713 B2 | 12/2004 | Bradley et al. |
| 7,161,448 B2 | 1/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,369,013 B2 | 5/2008 | Fazzio et al. |
| 7,388,454 B2 | 6/2008 | Ruby et al. |
| 7,561,009 B2 | 7/2009 | Larson, III et al. |
| 7,629,865 B2 | 12/2009 | Ruby et al. |

(Continued)

OTHER PUBLICATIONS

Co-pending U.S. Appl. No. 14/725,176, filed May 29, 2015.

*Primary Examiner* — Robert J Pascal
*Assistant Examiner* — Jorge Salazar, Jr.

(57) ABSTRACT

A bulk acoustic wave (BAW) resonator comprises: a first electrode; a second electrode comprising a plurality of sides, wherein at least one of the sides is a connection side; a piezoelectric layer disposed between the first and second electrodes, and an acoustic reflective element disposed beneath the first electrode, the second electrode and the piezoelectric layer, wherein an overlap of the reflective element, the first electrode, the second electrode, and the piezoelectric layer defines an active area of the acoustic resonator; a bridge adjacent to a termination of the active area of the BAW resonator; and a discontinuity disposed in the bridge.

43 Claims, 6 Drawing Sheets

(56) References Cited

U.S. PATENT DOCUMENTS

| | | |
|---|---|---|
| 7,714,684 B2 | 5/2010 | Ruby et al. |
| 7,758,979 B2 * | 7/2010 | Akiyama .............. B81B 3/0021 |
| | | 428/698 |
| 7,791,434 B2 | 9/2010 | Fazzio et al. |
| 8,089,195 B2 | 1/2012 | Sinha et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,330,556 B2 | 12/2012 | Miller et al. |
| 8,436,516 B2 | 5/2013 | Ruby et al. |
| 8,692,631 B2 | 4/2014 | Zhang |
| 8,902,023 B2 | 12/2014 | Choy et al. |
| 9,197,185 B2 | 11/2015 | Zou et al. |
| 2006/0103492 A1 * | 5/2006 | Feng .................. H03H 9/02118 |
| | | 333/187 |
| 2007/0205850 A1 | 9/2007 | Jamneala et al. |
| 2011/0180391 A1 | 7/2011 | Larson, III et al. |
| 2011/0266925 A1 | 11/2011 | Ruby et al. |
| 2012/0177816 A1 | 7/2012 | Larson, III et al. |
| 2012/0326807 A1 | 12/2012 | Choy et al. |
| 2013/0015747 A1 | 1/2013 | Ruby et al. |
| 2013/0049545 A1 | 2/2013 | Zou et al. |
| 2014/0118090 A1 | 5/2014 | Larson, III |
| 2014/0132117 A1 | 5/2014 | Larson, III |
| 2014/0175950 A1 | 6/2014 | Zou et al. |
| 2014/0225682 A1 | 8/2014 | Burak et al. |
| 2014/0292150 A1 | 10/2014 | Zou et al. |
| 2014/0354109 A1 | 12/2014 | Larson, III |
| 2015/0244347 A1 | 8/2015 | Feng et al. |

* cited by examiner

BULK ACOUSTIC WAVE (BAW) RESONATOR STRUCTURE

BACKGROUND

Electrical resonators are used in many applications. For example, in many wireless communications devices, radio frequency (rf) and microwave frequency resonators are configured as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a bulk acoustic wave (BAW) resonator. Typically, there are two types of BAW resonators: a Film Bulk Acoustic Resonator (FBAR) and a solidly mounted bulk acoustic resonator (SMR). Both the FBAR and the SMR comprise acoustic stacks that are disposed over a reflective element. The reflective element of an FBAR is a cavity, normally in a substrate over which the acoustic stack is mounted. The reflective element of an SMR is a Bragg reflector comprising alternating layers of high acoustic impedance and low acoustic impedance layers.

BAW resonators have the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

Desirably, the BAW resonator excites only thickness-extensional (TE) modes, which are longitudinal mechanical waves having propagation (k) vectors in the direction of propagation. The TE modes desirably travel in the direction of the thickness (e.g., y-direction) of the piezoelectric layer.

Unfortunately, acoustic energy can be lost to regions of the BAW resonator structure that are outside the active area of the BAW resonator. This acoustic energy is manifest in various types of acoustic modes including, for example, so-called lateral modes, which have propagation vectors in a direction that are perpendicular to the direction of TE modes, the desired modes of operation. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

What is needed, therefore, is a BAW resonator structure that overcomes at least the shortcomings of known BAW resonators.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
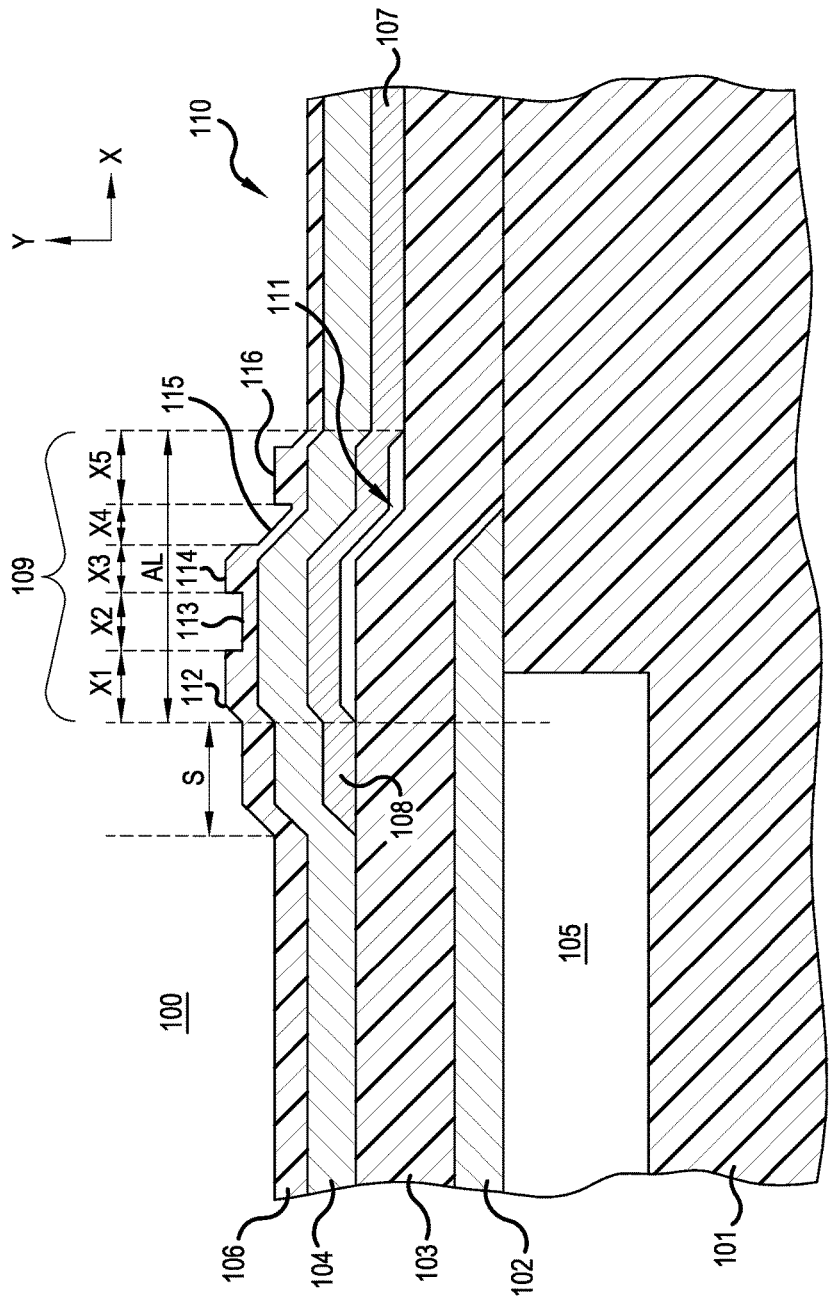
FIG. 1A shows a cross-sectional view of a bulk acoustic wave (BAW) resonator in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

The present teachings relate generally to bulk acoustic wave (BAW) resonators including FBARs, SMRs, double bulk acoustic resonators (DBARs) and coupled resonator filters (CRFs), BAW resonator structures comprising such devices, and electronic components (e.g. electrical filters) comprising such BAW resonator structures. When connected in a selected topology, a plurality of the resonators can act as an electrical filter. For example, FBARs and SMRs may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers (diplexers, triplexers, quadplexers, quintplexers, etc.).

A variety of devices, structures thereof, materials and methods of fabrication are contemplated for the BAW resonators of the apparatuses of the present teachings. Various details of such devices and corresponding methods of fabrication may be found, for example, in one or more of the following U.S. patents: U.S. Pat. No. 6,107,721, to Lakin; U.S. Pat. Nos. 5,587,620, 5,873,153, 6,507,983, 7,388,454, 7,629,865, 7,714,684, and 8,436,516 to Ruby et al.; U.S. Pat. Nos. 7,369,013, 7,791,434, and 8,230,562 to Fazzio, et al.; U.S. Pat. Nos. 7,280,007, and 8,188,810 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009 and 7,358,831 to Larson, III et al.; U.S. Pat. No. 9,197,185 to Zou, et al., U.S. Patent Application Publication No. 20120326807 to Choy, et al.; U.S. Patent Application Publications Nos. 20110180391 and 20120177816 to Larson III, et al.; U.S. Patent Application Publication No. 20070205850 to Jamneala et al.; U.S. Patent Application Publication No. 20110266925 to Ruby, et al.; U.S. Patent Application Publication No. 20130015747 to Ruby, et al.; U.S. Patent Application Publication No. 20130049545 to Zou, et al.; U.S. Patent Application Publication No. 20140225682 to Burak, et al.; U.S. Patent Application Publication No. 20140132117 to John L. Larson III; U.S. Patent Application Publication Nos.: 20140118090 and 20140354109 Grannen, et al.; U.S. Patent Application Publication Nos. 20140292150, and 20140175950 to Zou, et al.; and U.S. Patent Application Publication No. 20150244347 to Feng, et al. The entire disclosure of each of the patents, and patent application publications listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

In accordance with a representative embodiment, a BAW resonator, comprises: a lower electrode; an upper electrode comprising a plurality of sides, wherein at least one of the sides is a connection side; a piezoelectric layer disposed between the lower and upper electrodes, and an acoustic reflective element disposed beneath the lower electrode, the upper electrode and the piezoelectric layer, wherein an overlap of the reflective element, the lower electrode, the upper electrode, and the piezoelectric layer defines an active area of the acoustic resonator; a bridge adjacent to a termination of the active area of the BAW resonator; and a discontinuity disposed in the bridge. As described more fully below, the discontinuity (or plurality of discontinuities) serves as reflection points for acoustic modes traveling in the bridge. As such, the acoustic modes are partially reflected back into the active region of the BAW resonator, thereby reducing the extent of lost acoustic energy. Beneficially, a reduction of acoustic energy loss from discontinuities is realized, resulting in improvements in Q and parallel impedance (Rp) of the BAW resonator.

FIG. 1A is a cross-sectional view of a BAW resonator 100 in accordance with an illustrative embodiment. The BAW resonator 100 comprises a substrate 101, which illustratively comprises silicon (Si) or other suitable material. A first electrode 102 (lower electrode) is disposed over the substrate 101, and extends across an acoustic reflector 105 disposed in the substrate 101, and is disposed over an edge of the acoustic reflector 105 as shown. A piezoelectric layer 103 is disposed over the first electrode 102 and a second electrode 104 (upper electrode) is disposed over the piezoelectric layer 103. As such, the piezoelectric layer 103 has a first surface in contact with a first electrode 102 and a second surface in contact with the second electrode 104.

The BAW resonator also comprises a passivation layer 106 disposed over the second electrode 104. The passivation layer 106 may be, for example, AlN, silicon carbide (SiC), BSG, $SiO_2$, SiN, or polysilicon. Illustratively, the passivation layer may be as described by Miller et al., U.S. Pat. No. 8,330,556 (issued Dec. 11, 2012), which is hereby incorporated by reference in its entirety. Generally, the thickness of the passivation layer 106 must be sufficient to insulate all layers of the acoustic stack from the environment, including protection from moisture, corrosives, contaminants, debris and the like. By way of example, the passivation layer 106 has a thickness of approximately 100 nm to approximately 600 nm.

The first and second electrodes 102, 104 include an electrically conductive material (e.g., molybdenum or tungsten), and each may comprise one or more layers. The first and second electrodes provide an oscillating electric field in the y-direction, which is the direction of the thickness of the piezoelectric layer 103. In the present illustrative embodiment, the y-axis (of the coordinate system depicted in FIG. 1A) is the axis of the desired TE (longitudinal) mode(s) for the resonator.

Generally, the piezoelectric layer 103 comprises highly-textured piezoelectric material. In certain embodiments, the piezoelectric layer 103 of representative embodiments may also comprise one or more rare-earth (e.g., scandium (Sc)) doped layers of piezoelectric material (e.g., aluminum nitride (AlN)) as described in certain patent applications incorporated by reference above (e.g., U.S. Patent Application Publication 20140132117; and U.S. patent application Ser. No. 14/191,771 to Feng, et al.). Notably, doping the piezoelectric layer 103 with certain rare-earth dopants results in an enhanced piezoelectric coefficient $d_{33}$ in the piezoelectric layer 103, and an enhanced electromechanical coupling coefficient $kt^2$ by incorporating one or more rare earth elements into the crystal lattice of a portion of the piezoelectric layer. By way of illustration, the doping concentration of scandium is generally in the range of approximately 0.5% to less than approximately 10%. In certain embodiments, the doping concentration of scandium is in the range of approximately 3.0% to approximately 30.0%. For purposes of clarification, the atomic consistency of an AlN piezoelectric layer doped to 3.0% may then be represented as $Al_{0.47}N_{0.50}Sc_{0.03}$.

The acoustic reflector 105 may be a cavity filled with air, or a distributed Bragg reflector (DBR) comprising multiple acoustic impedance layers.

The BAW resonator 100 also comprises a layer 107, which comprises a frame element 108 (also referred to as an outie when disposed in the active area (described below) of the BAW resonator 100) having a width "S" as depicted in FIG. 1A. The layer 107 is illustratively disposed over the piezoelectric layer 103 and beneath the second electrode 104, and, as such, the frame element 108 is identically disposed. This is merely illustrative, as frame elements (not shown) may be disposed at other layers that make up the acoustic stack of the BAW resonator. Notably, the layer 107 may comprise more than one frame element. Alternatively, the layer 107 may comprise a recess (often referred to as an 'innie' when disposed in the active area (described below) of the BAW resonator), or a combination of "outies" and "innies." Moreover, the "innies" and "outies" may be provided on one or more sides of the BAW resonator 100. As is known, "innies" and "outies" provide an acoustic impedance mismatch at the perimeter of the active area (described below) of the BAW resonator 100, suppress unwanted lateral modes, and improve reflections of acoustic waves at the perimeter of the active area. As such, the "innies" and "outies" serve to reduce acoustic losses in the BAW resonator 100. Further details of the use, formation and benefits of "innies" and "outies" are found for example, in one or more of the above-incorporated U.S. Pat. Nos. 7,161,448 and 7,388,454 to Ruby, et al.; U.S. Pat. No. 7,280,007 to Feng, et al.; U.S. Pat. No. 7,369,013 to Fazzio, et al.; U.S. Pat. No. 7,714,684 to Ruby, et al.; and the above incorporated U.S. Patent Application Publication 20070205850.

The BAW resonator 100 also comprises a bridge 109 provided on a connection side 110 of the BAW resonator 100. The connection side 110 is connected to a signal line (not shown) and electronic components (not shown) selected for the particular application of the BAW resonator 100.

The bridge 109 comprises a gap 111 formed beneath a portion of the second electrode 104. Illustratively, the gap 111 comprises air. However, the gap 111 may comprise other materials including low acoustic impedance materials, such as carbon (C) doped $SiO_2$, which is also referred as Black-diamond; or dielectric resin commercially known as SiLK; or benzocyclobutene (BCB). Such low acoustic impedance materials may be provided in the gap 111 by known methods. The low acoustic impedance material may be provided after removal of sacrificial material used to form the gap 111 (as described below), or may be used instead of the sacrificial material in the gap 111, and not removed.

The gap 111 mechanically decouples the first electrode 102, and the piezoelectric layer 103 from the second electrode 104, and marks the boundary between the active region and the inactive region of the BAW resonator 100. To this end, the region of overlap of the first and second electrodes 102, 104, the piezoelectric layer 103 and the acoustic reflector 105 is referred to as an active area of the BAW resonator 100. By contrast, an inactive area of the BAW resonator 100 comprises a region of overlap between first electrode 102, or second electrode 104, or both, and the piezoelectric layer 103 not disposed over the acoustic reflector 105. Illustratively, in the representative embodiment depicted in FIG. 1A, the inactive area comprises a region of overlap between the first electrode 102, the piezoelectric layer 103, and the second electrode 104, that is not disposed over acoustic reflector 105. As is known, it is beneficial to the performance of the resonator to reduce the area of the inactive area of the BAW resonator 100 to the extent practical.

The bridge 109 thus reduces the area of an inactive region of the BAW resonator 100. The inactive region of the BAW resonator 100 creates a parasitic capacitance, which in an equivalent circuit is electrically in parallel with the intrinsic capacitance of the active area of the BAW resonator 100. This parasitic capacitance degrades the effective coupling coefficient ($kt^2$), and therefore it is beneficial to reduce the parasitic capacitance. Beneficially, reducing the area of the inactive region improves the effective coupling coefficient ($kt^2$).

Moreover, the acoustic impedance mismatch provided by the gap 111 results in the reflection of acoustic waves at the boundary that may otherwise propagate out of the active area 114 and be lost, resulting in energy loss. By preventing such losses, the bridge 109 results in an increased Q-factor in the BAW resonator 100. Moreover, the termination of the second electrode 104 at position 110 terminates the active area 114 of the BAW resonator 100 and reduces losses by creating an acoustic impedance mismatch. This also provides an improvement in the Q-factor.

As depicted in FIG. 1A, the bridge 109 comprises portions of the layer 107, upper electrode 104, and passivation layer 106 disposed over gap 111. The bridge has a width "AL" as shown in FIG. 1A, and forms an acoustic waveguide. As such, standing waves can exist in the bridge 109, and comprise propagating waves and reflected waves generated in the active area of the BAW resonator 100. These standing waves travel laterally (x-direction of the coordinate system depicted in FIG. 1A), and can comprise a variety of modes, which can have differing wavelengths. By way of example, Rayleigh-Lamb (lateral or spurious) modes are in the x,z dimensions of the piezoelectric layer 103. These lateral modes are due to interfacial mode conversion of the longitudinal mode traveling in the z-direction; and due to the creation of non-zero propagation vectors, $k_x$ and $k_z$, for both the TE mode and the various lateral modes (e.g., the S0 mode and the zeroth and first flexure modes, A0 and A1), which are due to the difference in effective velocities between the regions where electrodes are disposed and the surrounding regions of the resonator where there are no electrodes. As can be appreciated, these modes, if unimpeded, leak energy away from the active area of the BAW resonator 100, resulting in a reduction in the Q-factor, and degradation of $R_p$. Beneficially, the present teachings provide one or more discontinuities in one or more of the layers that comprise the bridge 109, and partially reflect the acoustic waves supported by the layers of the bridge 109.

A quantitative and qualitative understanding of the Q of a resonator may be obtained by plotting on a Smith Chart the ratio of the reflected energy to applied energy (i.e., the $S_{11}$ parameter) as the frequency is varied for the case in which one electrode is connected to ground and another to signal, for a resonator with an impedance equal to the system impedance at the resonant frequency. As the frequency of the applied energy (e.g., RF signal) is increased, the magnitude/phase of the resonator sweeps out a circle in a clockwise fashion on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the BAW resonator. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 mode and the zeroth and first flexure modes, A0 and A1), which are due to the difference in effective velocities between the regions where electrodes are disposed and the surrounding regions of the resonator where there are no electrodes.

Regardless of their source, the lateral modes are parasitic in many resonator applications. For example, the parasitic lateral modes couple at the interfaces (e.g., in the waveguide comprised of the layer stack of the bridge 109) of the resonator and remove energy available for the longitudinal modes and thereby reduce the Q-factor of the resonator device. Notably, as a result of parasitic lateral modes and other acoustic losses, sharp reductions in Q can be observed on a Q-circle of the Smith Chart of the $S_{11}$ parameter. These sharp reductions in Q-factor are known as "rattles" or "loop-de-loops," which are shown and described in the parent application.

In the representative embodiment depicted in FIG. 1A, first~fifth discontinuities 112~116 are provided in the passivation layer 106. The first~fifth discontinuities 112~116 have respective widths $x_1$-$x_5$ along the width AL of the bridge 109. Notably, the second and fourth discontinuities 113, 115 are recesses in the passivation layer 106, and thus create a change in the thickness of the layer stack that comprises the waveguide of the bridge 109. These recesses each have two vertical (y-direction) sides (subtended by vertical dotted lines in FIG. 1A) where the thickness of the passivation layer 106, and thus the thickness of the layer stack that comprises the waveguide of the bridge 109 is changed.

The first~fifth discontinuities 112~116 are acoustic impedance discontinuities. To this end, the recesses of the second and fourth discontinuities 113, 115 may comprise air, or may be filled with a material having an acoustic impedance that is different than the material of the passivation layer 106 to foster reflections. When an acoustic wave traveling in the waveguide comprising the layer stack of the bridge 109 is incident on the acoustic impedance discontinuity created by the second and fourth discontinuities 113, 115, a reflection occurs and a wave traveling laterally is reflected back toward the active area of the BAW resonator 100. Accordingly, first~fifth 112~116 discontinuities cause reflections of the acoustic waves supported by the waveguide of the bridge 109, and portions of these acoustic waves are reflected back to the active region of the BAW resonator 100. As such, through reflections at first~fifth 112~116, energy loss to acoustic modes in the layers of the bridge 109 can be mitigated with the at least a portion of reflected lateral modes being converted to longitudinal modes through mode conversion. Ultimately, this results in an overall improvement in the Q-factor.

In certain embodiments, the widths $x_1$-$x_5$ of first~fifth discontinuities 112~116 can be one-quarter of the wavelength ($\lambda/4$) of a selected mode. As such, the first~fifth discontinuities 112~116 can be alternating high acoustic impedance/low acoustic impedance with thicknesses (i.e., widths) $\lambda/4$ of a selected mode, and thereby provide a lateral acoustic mirror. However, as noted below, there are often a number of acoustic waves of different wavelengths supported by the waveguide of the layer stack of the bridge 109, so the selection of widths $x_1$-$x_5$ of first~fifth discontinuities 112~116 to be one-quarter of the wavelength ($\lambda/4$) of a selected (e.g., dominant) mode is merely illustrative. Accordingly, in other representative embodiments, at least one, if not all of the widths $x_1$-$x_5$ of first~fifth discontinuities 112~116 are not the same, or are not all equal to the $\lambda/4$ of a selected mode, or both.

Figure 1B:
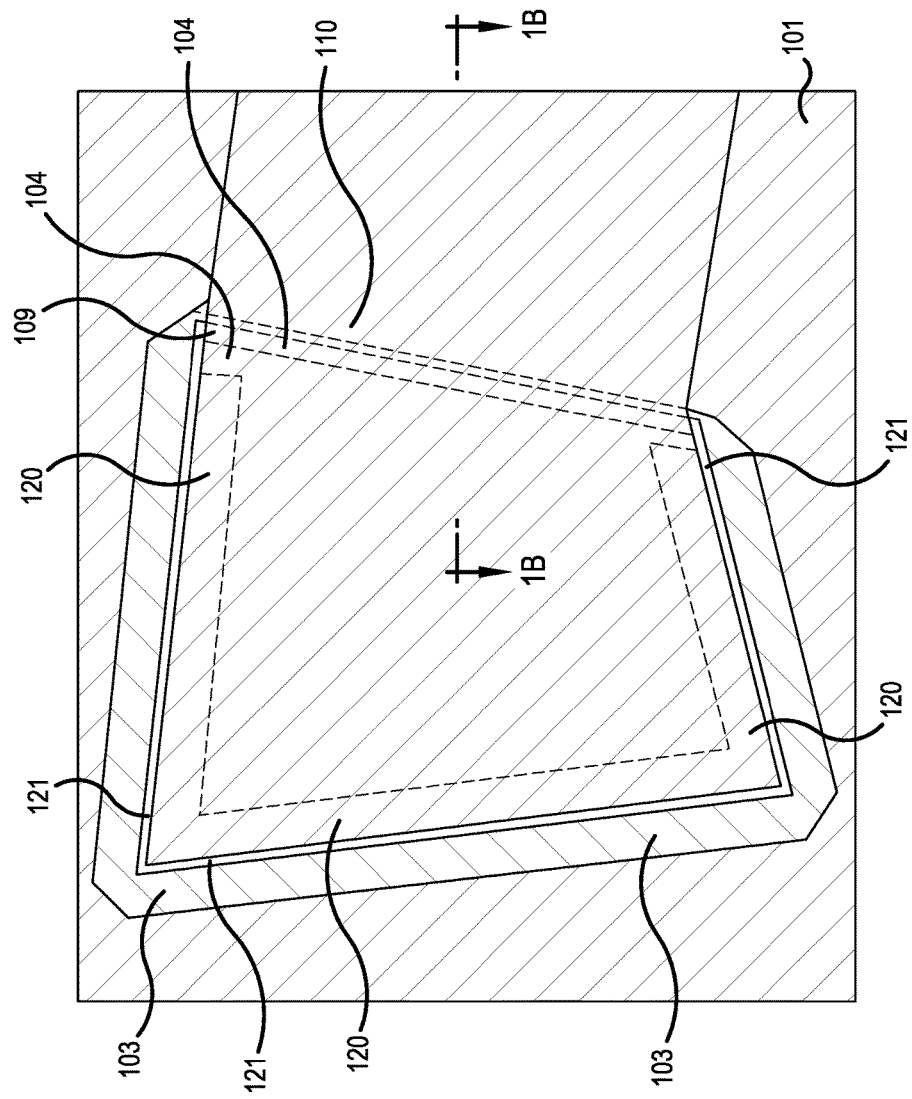
FIG. 1B shows a top view of a bulk acoustic wave (BAW) resonator in accordance with a representative embodiment.

FIG. 1B shows a top view of BAW resonator 100 shown in cross-sectional view in FIG. 1A along line 1B-1B, and in accordance with a representative embodiment. The features of the BAW resonator 100 depicted in FIG. 1B are common to those of BAW resonator 100 described in connection with representative embodiment of FIG. 1A. The details of common features, characteristics and benefits thereof often are often not repeated in order to avoid obscuring the presently described embodiments. Moreover, various aspects of the BAW resonator 100 are described in above-incorporated U.S. Pat. No. 8,902,023 and U.S. Patent Application Publication No. 20150244347. Notably, the passivation layer 106 is not shown to enable illustration of other features in FIG. 1B.

In a representative embodiment, cantilevered portions 120 are provided along each non-connection side 121 and have the same width. This is merely illustrative, and it is also contemplated that at least one, but not all non-connection sides 121, comprise a cantilevered portion 120. It is further noted that electrical connections may be made to more than one side (e.g., more than just connection side 110), with the remaining edges being non-connection sides and comprising cantilevered portions 120 because in many applications, electrical connections are made to two or more sides of the BAW resonator 100. Furthermore, it is contemplated that the second electrode 104 comprises more or fewer than four sides as shown. For example, a pentagonal-shaped (not shown) second electrode is contemplated comprising four sides with cantilevered portions (e.g., cantilevered portion 120) on one or more of the sides, and one or more of the sides providing a connection side(s). In a representative embodiment, the shape of the first electrode 102 is substantially identical to the shape of the second electrode 104. Notably, the first electrode 102 may comprise a larger area than the second electrode 104, and the shape of the first electrode 102 may be different than the shape of the second electrode 104. Finally, it is noted that the cantilevered portions 120 may have the same width, although this is not essential, and the cantilevered portions 120 may have different widths.

The cantilevered portion(s) 120 of the representative embodiments provide a change in the acoustic impedance at the boundary of the active area of the bulk acoustic wave (BAW) resonator 100. As a result, reflections of lateral modes at the boundary are promoted. In a representative embodiment, the boundary of the active area of the bulk acoustic wave (BAW) resonator and the cantilevered portion 120 is solid (electrodes and piezoelectric layer) and air, which presents a comparatively large impedance mismatch and a comparatively high reflection coefficient. As a result, lateral modes are comparatively highly reflected, which improves the Q-factor by two mechanisms. First, because the reflected lateral modes are not transmitted, their energy is not lost. Improving the losses by reducing transmission of lateral modes outside the active area of the bulk acoustic wave (BAW) resonator 100 can increase the Q-factor of the bulk acoustic wave (BAW) resonator 100. Second, a portion of the reflected lateral modes is converted into desired longitudinal modes. The greater the wave energy is in longitudinal modes, the higher the Q-factor. As a result, the cantilevered portion(s) 120 of the bulk acoustic wave (BAW) resonator 100 enhances the Q-factor of both the parallel and the series resonance (i.e., $Q_p$ and $Q_s$). Beneficially, the combination of the cantilevered portion 120 and the bridge 109 provides a further improvement in the Q-factor of the bulk acoustic wave (BAW) resonator 100. To this end, inclusion of the bridge 109 with the cantilevered portion(s) 120 in the BAW resonator 100 results in an improvement in the Q-factor at parallel resonance (Qp) and some impact on the Q-factor at series resonance (Qs).

Figure 2:
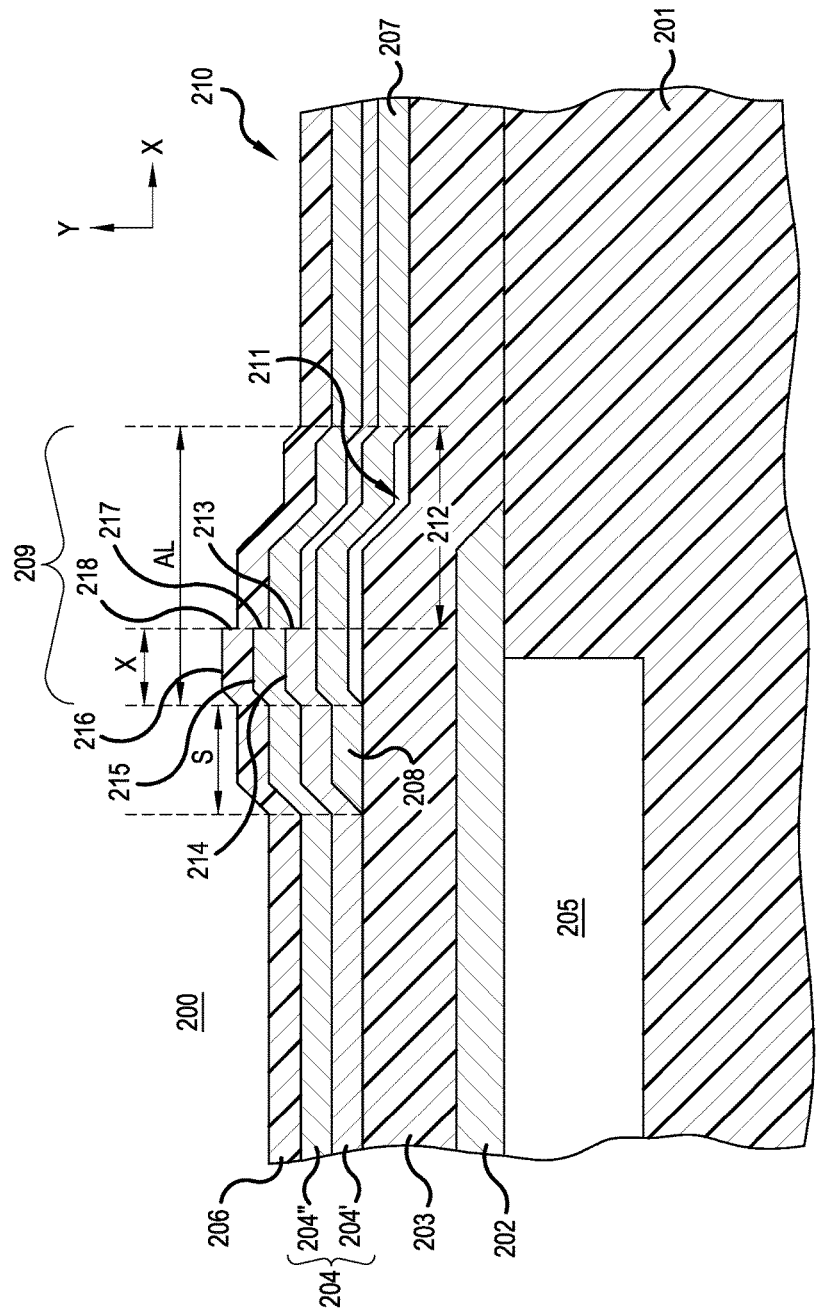
FIG. 2 shows a cross-sectional view of a bulk acoustic wave (BAW) resonator in accordance with a representative embodiment.

FIG. 2 is a cross-sectional view of a BAW resonator 200 in accordance with an illustrative embodiment. Many aspects of the BAW resonator 200 are common to the BAW resonator 100 described above in connection with FIG. 1A. The details of these common aspects may not be repeated in order to avoid obscuring the description of this embodiment.

The BAW resonator 200 comprises a substrate 201, which illustratively comprises silicon (Si) or other suitable material. A first electrode 202 is disposed over the substrate 201, and extends across an acoustic reflector 205 disposed in the substrate 201, and is disposed over an edge of the acoustic reflector 205 as shown. A piezoelectric layer 203 is disposed over the first electrode 202. A second electrode 204 comprising a first electrode layer 204' and a second electrode layer 204" is disposed over the piezoelectric layer 203. The first and second electrode layers 204', 204" may comprise two layers of the same material (e.g., molybdenum) or two layers of different materials (e.g. molybdenum and tungsten), as is known. The BAW resonator 200 also comprises a passivation layer 206 disposed over the second electrode 204. The BAW resonator 200 also comprises a layer 207, which comprises a frame element 208 (also referred to as an outie when disposed in the active area (described below) of the BAW resonator 200) having a width "S" as depicted in FIG. 2.

In the representative embodiment, the first electrode layer 204' has a reduced thickness in region 212 of the bridge 209, beginning at point 213. This reduction in the thickness creates first~third discontinuities 214~216 in the height (y-direction) in the first and second electrode layers 204', 204", and in the height of passivation layer 206. First~third discontinuities 214~216, which have a width "x," are created by a discontinuous thickness caused by thinning the first electrode layer 204'. Notably, these "vertical" (y-direction) discontinuities are singular at each layer. More generally, the width "x" of a discontinuity is not a property of the layer in which it is disposed, but rather a property of the layer stack in each section of the bridge. As such, the width "x" of a discontinuity can be one quarter wavelength of one mode, or non-equidistant widths in case there are multiple discontinuities.

The present teachings also contemplate multiple discontinuities in the horizontal direction, such as described in connection with FIG. 1A. To this end, more than one discontinuity in the thickness and along the x-axis of the first electrode layer 204' could be made, thereby creating a plurality of discontinuities in the horizontal dimension. As such, at each discontinuity in the first electrode layer 204' would cause a discontinuity in the height of the layers disposed thereover.

Finally, it is emphasized that providing discontinuities in the thickness of a layer stack of the bridge 209 is not limited to the first electrode layer 204'. Rather, layer 207, and second electrode layer 204" of the layer stack of the bridge could also be selectively thinned.

Notably, first~third discontinuities 214~216 are acoustic impedance discontinuities. To this end, the beginning at point 213, and similarly at points 217, 218 in the second electrode layer 204" and the passivation layer 206, an abrupt change in the medium occurs. For example, beginning at point 218, the medium in region 212 changes from the material of the passivation layer 206 to air. Similarly, beginning at points 217 and 218, changes in the medium occurs. As such, an acoustic wave traveling in the waveguide comprising the layer stack of the bridge 209 is incident on the acoustic impedance discontinuity created by the first~third discontinuities 214~216, reflection occurs and a wave traveling laterally is reflected back toward the active area of the BAW resonator 200. Like the discontinuities discussed above, first~third discontinuities 214~216 cause reflections of the acoustic waves supported by the waveguide of the bridge 209, and portions of these acoustic waves are reflected back to the active region of the BAW resonator 200. As such, energy loss to modes in the bridge 209 can be mitigated with the at least a portion of reflected lateral modes being converted to longitudinal modes through mode conversion. Ultimately, this results in an overall improvement in the Q-factor.

Figure 3:
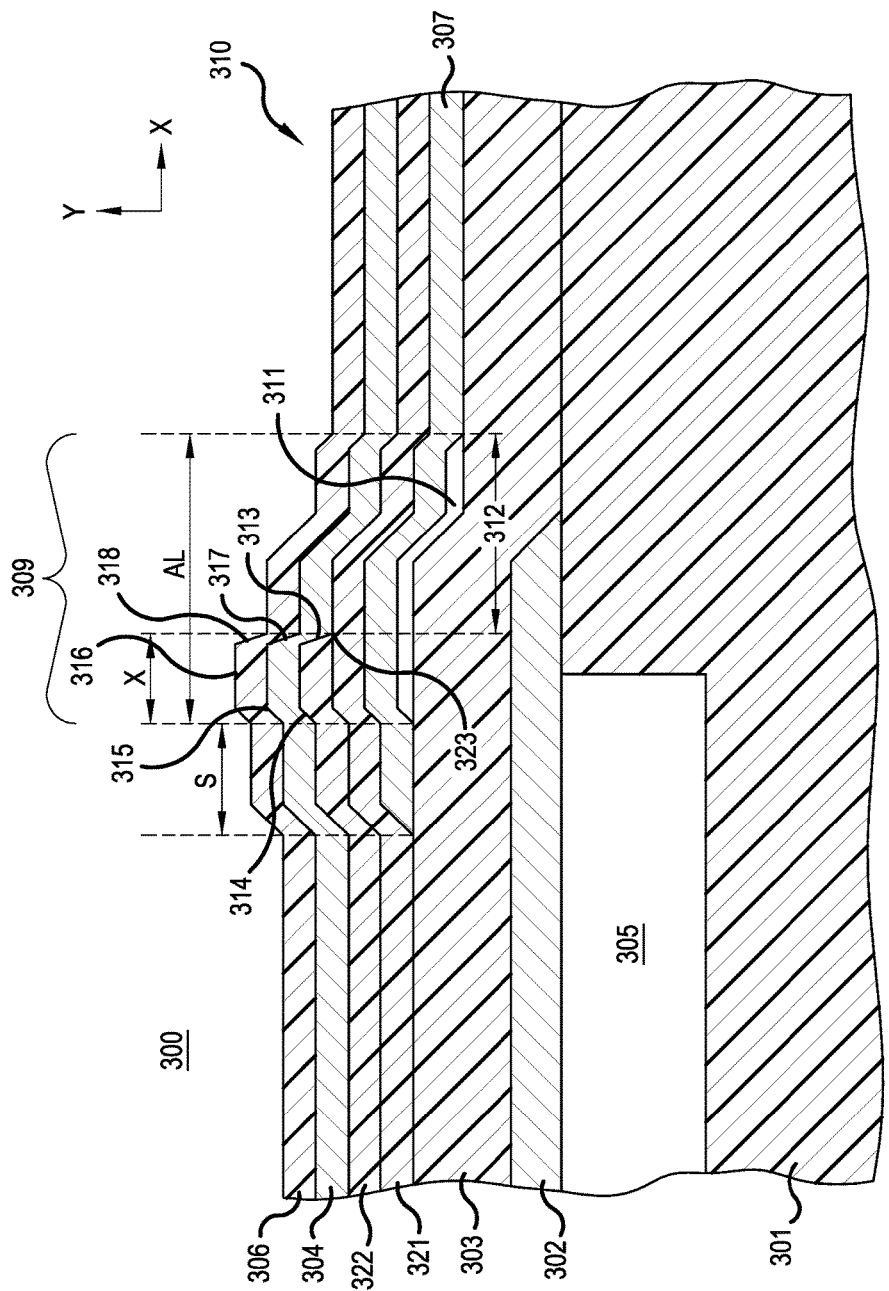
FIG. 3 shows a cross-sectional view of a bulk acoustic wave (BAW) resonator in accordance with a representative embodiment.

FIG. 3 is a cross-sectional view of a BAW resonator 300 in accordance with an illustrative embodiment. Many aspects of the BAW resonator 300 are common to BAW resonators 100, 200 described above in connection with FIGS. 1A-2. The details of these common aspects may not be repeated in order to avoid obscuring the description of this embodiment.

The BAW resonator 300 comprises a substrate 301, which illustratively comprises silicon (Si) or other suitable material. A first electrode 302 is disposed over the substrate 301, and extends across an acoustic reflector 305 disposed in the substrate 301, and is disposed over an edge of the acoustic reflector 305 as shown. A piezoelectric layer 303 is disposed over the first electrode 302. An interposer 321 is disposed over the piezoelectric layer 303, and a temperature compensation layer 322 is disposed over the interposer 321. A second electrode 304 is disposed over the temperature compensation layer 322. The interposer 321 is made of an electrically conductive material (e.g., the same material as the second electrode 304), and the temperature compensation layer 322 is typically an oxide or similar dielectric material. As such, the interposer 321 and the second electrode 304 are electrically connected at point 323 to short any parasitic capacitance by the temperature compensation layer's being disposed between two electrically conductive layers. Further details of temperature compensation structures in BAW resonators such as depicted in FIG. 3 can be found in above incorporated U.S. Pat. Nos. 8,436,516 and 9,197,185; and in above incorporated U.S. Patent Application Publications 20140292150, and 20140175950.

In the representative embodiment, the temperature compensation layer 322 terminates at point 313. This termination creates first~third discontinuities 314~316 in the height (y-direction) of second electrode 304, and in the height of passivation layer 306. First~third discontinuities 314~316, which have a width "x," are created by a discontinuous thickness caused by removal of the temperature compensation layer 322 beginning at point 313. Notably, these "vertical" (y-direction) discontinuities are singular at each layer.

Finally, it is emphasized that providing discontinuities by terminating a layer stack of the bridge 309 is not limited to the temperature compensation layer 322. Rather, layer 307 or passivation layer 306 of the layer stack of the bridge 309 could also be selectively terminated. However, because electrical connections are made to the connection side, at least one of the layer 307 and the second electrode 304 must not terminate to the point of electrical connection.

Notably, first~third discontinuities 314~316 are acoustic impedance discontinuities. To this end, the beginning at point 313, and similarly at points 317, 318 in the temperature compensation layer 322, the second electrode 304, and the passivation layer 306, an abrupt change in the medium occurs. For example, beginning at point 318, the medium in region 312 changes from the material of the passivation layer 306 to air. Similarly, beginning at points 317 and 318, changes in the respective media occurs Like the discontinuities discussed above, first~third discontinuities 314~316 cause reflections of the acoustic waves supported by the waveguide of the bridge 309, and portions of these acoustic waves are reflected back to the active region of the BAW resonator 300. As such, energy loss to modes in the bridge 309 can be mitigated with the at least a portion of reflected lateral modes being converted to longitudinal modes through mode conversion. Ultimately, this results in an overall improvement in the Q-factor.

Figure 4:
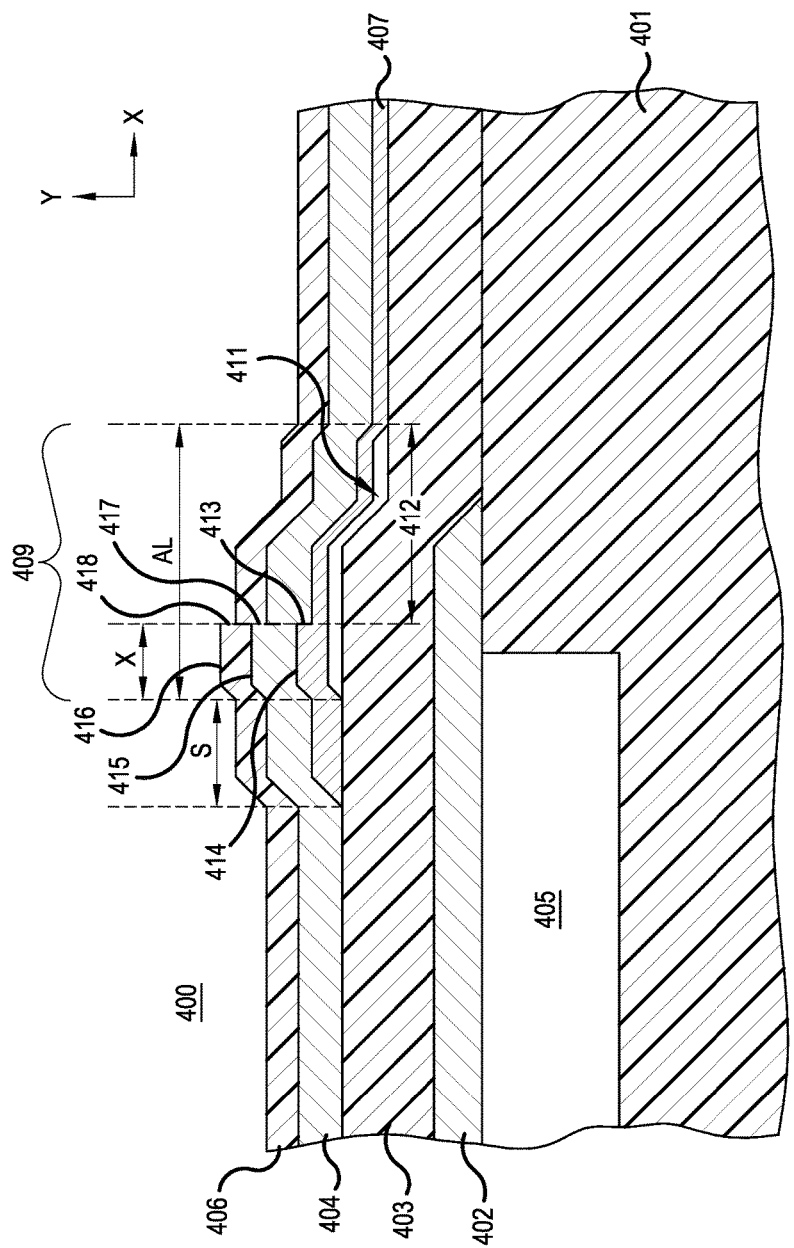
FIG. 4 shows a cross-sectional view of a bulk acoustic wave (BAW) resonator in accordance with a representative embodiment.

FIG. 4 is a cross-sectional view of a BAW resonator 400 in accordance with an illustrative embodiment. Many aspects of the BAW resonator 400 are common to the BAW resonator 100 described above in connection with FIGS. 1A-3. The details of these common aspects may not be repeated in order to avoid obscuring the description of this embodiment.

The BAW resonator 400 comprises a substrate 401, which illustratively comprises silicon (Si) or other suitable material. A first electrode 402 is disposed over the substrate 401, and extends across an acoustic reflector 405 disposed in the substrate 401, and is disposed over an edge of the acoustic reflector 405 as shown. A piezoelectric layer 403 is disposed over the first electrode 402. A second electrode 404 is disposed over the piezoelectric layer 403. The BAW resonator 400 also comprises a passivation layer 406 disposed over the second electrode 404.

In the representative embodiment, the layer 407 has a reduced thickness in region 412, beginning at point 413. This reduction in the thickness creates first~third discontinuities 414~416 in the height (y-direction) in the layer 407, and in the height of the second electrode 404 and the passivation layer 406. First~third discontinuities 414~416, which have a width "x," are created by a discontinuous thickness cause by thinning the layer 407. Notably, these "vertical" (y-direction) discontinuities are singular at each layer.

The present teachings also contemplate multiple discontinuities in the horizontal direction, such as described in connection with FIG. 1A. To this end, more than one discontinuity in the thickness and along the x-axis of the layer 407 could be made, thereby creating a plurality of discontinuities in the horizontal dimension. As such, each discontinuity in the layer 407 would cause a discontinuity in the height of the layers disposed thereover.

Finally, and as noted it is emphasized that providing discontinuities in the thickness of a layer stack of the bridge 409 is not limited to the layer 407. Rather, second electrode 204 of the layer stack of the bridge could also be selectively thinned.

Notably, first~third discontinuities 414~416 are acoustic impedance discontinuities. To this end, beginning at point 413, and similarly at points 417, 418 second electrode 404 and the passivation layer 406, an abrupt change in the medium occurs. For example, beginning at point 418, the medium in region 412 changes from the material of the passivation layer 406 to air. Similarly, beginning at points 417 and 418, changes in the medium occurs. As such, an acoustic wave traveling in the waveguide comprising the layer stack of the bridge 409 is incident on the acoustic impedance discontinuity created by the first~third discontinuities 414~416, reflection occurs and a wave traveling laterally is reflected back toward the active area of the BAW resonator 400. Like the discontinuities discussed above, first~third discontinuities 414~416 cause reflections of the acoustic waves supported by the waveguide of the bridge 409, and portions of these acoustic waves are reflected back to the active region of the BAW resonator 400. As such, energy loss to modes in the bridge 409 can be mitigated with the at least a portion of reflected lateral modes being converted to longitudinal modes through mode conversion. Ultimately, this results in an overall improvement in the Q-factor.

Figure 5:
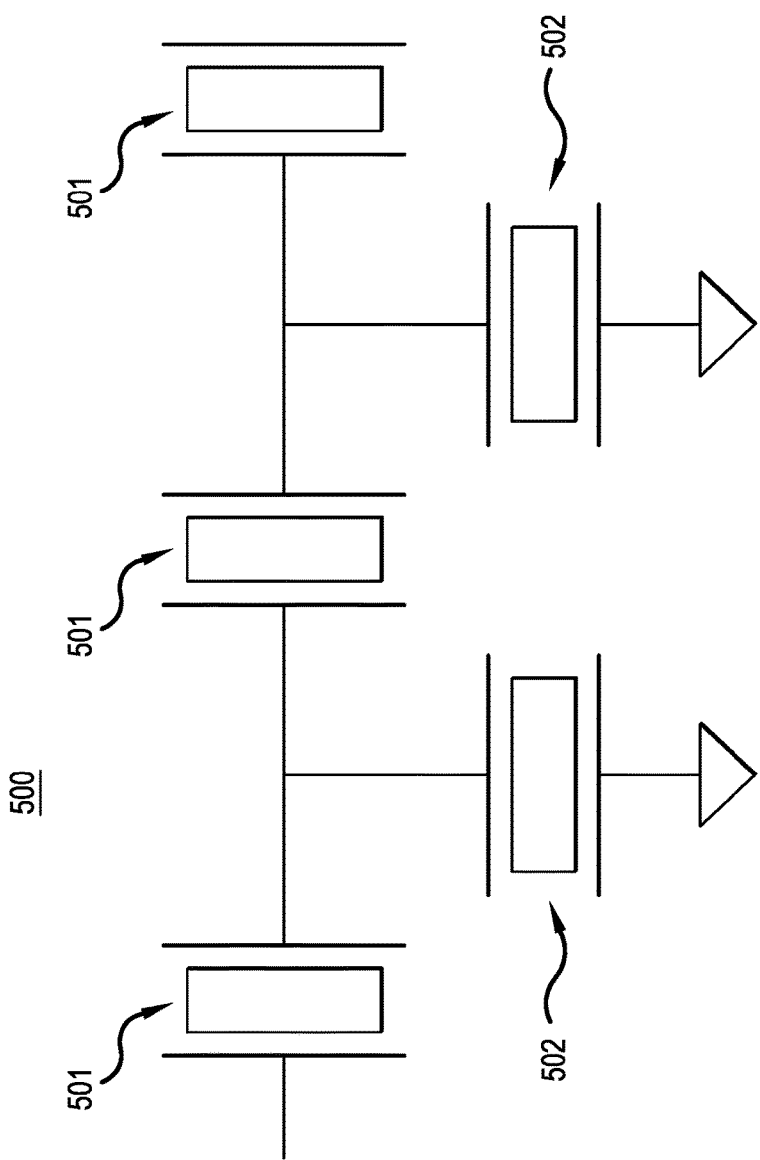
FIG. 5 shows a simplified schematic block diagram of an electrical filter in accordance with a representative embodiment.

When connected in a selected topology, a plurality of bulk acoustic wave (BAW) resonators 100, 200, 300 and 400 can function as an electrical filter. FIG. 5 shows a simplified schematic block diagram of an electrical filter 500 in accordance with a representative embodiment. The electrical filter 500 comprises series bulk acoustic wave (BAW) resonators 501 and shunt bulk acoustic wave (BAW) resonators 502. The series resonators 501 and shunt resonators 502 may comprise the bulk acoustic wave (BAW) resonators 100, 200, 300, and 400 described in connection with the representative embodiments of FIGS. 1A-4. The electrical filter 500 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 500 is merely illustrative and other topologies are contemplated. Moreover, the bulk acoustic wave (BAW) resonators of the representative embodiments are contemplated in a variety of applications besides duplexers.

In alternative embodiments, piezoelectric layers doped with two or more rare earth elements may be formed in resonator stacks of various other types of resonator devices, without departing from the scope of the present teachings. For example, a piezoelectric layer may be formed in resonator stacks of a stacked bulk acoustic resonator (SBAR) device, a double bulk acoustic resonator (DBAR) device, or a coupled resonator filter (CRF) device.

In accordance with illustrative embodiments, bulk acoustic wave (BAW) resonators for various applications such as in electrical filters are described having an electrode comprising a cantilevered portion. Additionally, bulk acoustic wave (BAW) resonators for various applications such as in electrical filters are described having an electrode comprising a cantilevered portion and a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. A bulk acoustic wave (BAW) resonator, comprising:
a first electrode;
a second electrode comprising a plurality of sides, wherein at least one of the sides is a connection side;
a piezoelectric layer disposed between the first and second electrodes, and
an acoustic reflective element disposed beneath the first electrode, the second electrode and the piezoelectric layer, wherein a contacting overlap of the acoustic reflective element, the first electrode, the second electrode, and the piezoelectric layer defines an active area of the BAW resonator;
a bridge adjacent to a termination of the active area of the BAW resonator;
a layer at least a part of which is disposed over a gap, and between the piezoelectric layer and the second electrode, the layer comprising a frame element, the frame element being disposed immediately adjacent to the termination of the active area; and
a discontinuity, which exists in the bridge.

2. The BAW resonator as claimed in claim 1, wherein the bridge comprises a plurality of layers, and the discontinuity in the bridge is in one of the layers in the bridge.

3. The BAW as claimed in claim 2, wherein the one layer is a passivation layer disposed over the second electrode.

4. The BAW resonator as claimed in claim 3, wherein the discontinuity in the passivation layer is the only discontinuity the bridge.

5. The BAW resonator as claimed in claim 3, wherein the discontinuity in the passivation layer is one of a plurality of discontinuities.

6. The BAW resonator as claimed in claim 5, wherein all of the plurality of discontinuities are only in the passivation layer.

7. The BAW resonator as claimed in claim 2, wherein the one layer is a part of the second electrode.

8. The BAW resonator as claimed in claim 2, wherein the discontinuity comprises a recess in the one layer.

9. The BAW resonator as claimed in claim 8, wherein a material having a different acoustic impedance than an acoustic impedance of the one layer is disposed in the one layer.

10. The BAW resonator as claimed in claim 2, wherein the second electrode comprises a first layer and a second layer, and the one layer is one of the first and second layers.

11. The BAW resonator as claimed in claim 1, wherein the discontinuity comprises a width that is substantially equal to a ratio of a wavelength of a mode of the BAW resonator.

12. The BAW resonator of claim 11, wherein the width is substantially equal to one-quarter wavelength ($\lambda/4$) of the mode of the BAW resonator.

13. The BAW resonator as claimed in claim 1, further comprising a temperature compensation layer.

14. The BAW resonator as claimed in claim 13, further comprising an interposer layer disposed over the piezoelectric layer, wherein the temperature compensation layer is disposed between the interposer layer and the second electrode.

15. The BAW resonator as claimed in claim 1, further comprising a cantilevered portion on at least one of the plurality of sides that is not the connecting side.

16. The BAW resonator as claimed in claim 15, wherein the cantilevered portion extends beyond a termination of the active area.

17. The BAW resonator as claimed in claim 1, wherein the piezoelectric layer is doped with a rare-earth element that improves an acoustic coupling coefficient.

18. The BAW resonator as claimed in claim 17, wherein the rare-earth element is scandium (Sc).

19. The BAW resonator as claimed in claim 1, wherein the discontinuity is a first discontinuity and the bridge further comprises a second discontinuity.

20. An electrical filter, comprising a plurality of bulk acoustic wave (BAW) resonators, each of the plurality of BAW resonators comprising:
a first electrode;
a second electrode comprising a plurality of sides, wherein at least one of the sides is a connection side;
a piezoelectric layer disposed between the first and second electrodes, and
an acoustic reflective element disposed beneath the first electrode, the second electrode and the piezoelectric layer, wherein an overlap of the acoustic reflective element, the first electrode, the second electrode, and the piezoelectric layer defines an active area of the BAW;
a bridge adjacent to a termination of the active area of the BAW resonator;
a layer at least a part of which is disposed over a gap, and between the piezoelectric layer and the second electrode, the layer comprising a frame element, the frame element being disposed immediately adjacent to the termination of the active area; and
a discontinuity, which exists in the bridge.

21. The electrical filter as claimed in claim 20, wherein the bridge comprises a plurality of layers, and the discontinuity in the bridge is in one of the layers in the bridge.

22. The electrical filter as claimed in claim 21, wherein the one layer is a part of the second electrode.

23. The electrical filter as claimed in claim 21, wherein the discontinuity comprises a recess in the one layer.

24. The electrical filter as claimed in claim 23, wherein a material having a different acoustic impedance than an acoustic impedance of the one layer is disposed in the one layer.

25. The electrical filter as claimed in claim 21, wherein the one layer is a passivation layer disposed over the second electrode.

26. The electrical filter as claimed in claim 21, wherein the second electrode comprises a first layer and a second layer, and the one layer is one of the first and second layers.

27. The electrical filter as claimed in claim 20, wherein the discontinuity is a first discontinuity and the bridge comprises a second discontinuity.

28. The electrical filter as claimed in claim 20, wherein the discontinuity is a first discontinuity, and the BAW resonator further comprises at least a second discontinuity.

29. The electrical filter as claimed in claim 20, wherein each of the BAW resonators further comprise a temperature compensation layer, and an interposer layer disposed over the piezoelectric layer, wherein the temperature compensation layer is disposed between the interposer layer and the second electrode.

30. The electrical filter as claimed in claim 20, wherein the discontinuity has a width substantially equal to a ratio of a wavelength of a mode of one or more of the plurality of BAW resonators.

31. The electrical filter as claimed in claim 30, wherein the ratio is substantially equal to one-quarter.

32. The electrical filter as claimed in claim 20, wherein each of the BAW resonators further comprises a cantilevered portion on at least one of the plurality of sides that is not the connecting side.

33. The electrical filter as claimed in claim 20, wherein the piezoelectric layer is doped with a rare-earth element that improves an acoustic coupling coefficient.

34. The electrical filter as claimed in claim 33, wherein the rare-earth element is scandium (Sc).

35. A bulk acoustic wave (BAW) resonator, comprising:
a first electrode;
a second electrode comprising a plurality of sides, wherein at least one of the sides is a connection side;
a piezoelectric layer disposed between the first and second electrodes, and
an acoustic reflective element disposed beneath the first electrode, the second electrode and the piezoelectric layer, wherein a contacting overlap of the acoustic reflective element, the first electrode, the second electrode, and the piezoelectric layer defines an active area of the BAW resonator;
a bridge adjacent to a termination of the active area of the BAW resonator; and
a plurality of discontinuities, which exist across an entire width of the bridge.

36. The BAW resonator as claimed in claim 35, wherein each of the plurality of discontinuities has a width that is substantially equal to a ratio of a wavelength of a mode of the BAW resonator.

37. The BAW resonator as claimed in claim 35, further comprising a temperature compensation layer.

38. The BAW resonator as claimed in claim 37, further comprising an interposer layer disposed over the piezoelectric layer, wherein the temperature compensation layer is disposed between the interposer layer and the second electrode.

39. The BAW resonator as claimed in claim 35, wherein the plurality of discontinuities comprise a recess and a frame element.

40. The BAW resonator as claimed in claim 35, wherein the bridge comprises a plurality of layers, and the plurality of discontinuities in the bridge are in only one of the layers in the bridge.

41. The BAW as claimed in claim 40, wherein the one layer is a passivation layer disposed over the second electrode.

42. The BAW resonator as claimed in claim 40, wherein the one layer is a part of the second electrode.

43. The BAW resonator as claimed in claim 42, wherein a material having a different acoustic impedance than an acoustic impedance of the one layer is disposed in the one layer.

* * * * *